(12) United States Patent
Jin et al.

(10) Patent No.: US 11,122,710 B2
(45) Date of Patent: Sep. 14, 2021

(54) HEAT DISSIPATION STRUCTURE FOR ELECTRONIC DEVICE AND ELECTRONIC DEVICE

(71) Applicant: Huawei Technologies Co., Ltd., Shenzhen (CN)

(72) Inventors: Linfang Jin, Dongguan (CN); Guo Yang, Minsk (BY); Shuainan Lin, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/925,433

(22) Filed: Jul. 10, 2020

(65) Prior Publication Data

US 2020/0344915 A1 Oct. 29, 2020

Related U.S. Application Data

(63) Continuation of application No. 16/337,052, filed as application No. PCT/CN2017/103830 on Sep. 27, 2017, now Pat. No. 10,729,036.

(30) Foreign Application Priority Data

Sep. 28, 2016 (CN) .......................... 201621093416.3

(51) Int. Cl.
*H05K 7/20* (2006.01)
(52) U.S. Cl.
CPC ..... *H05K 7/20518* (2013.01); *H05K 7/20472* (2013.01); *H05K 7/20509* (2013.01)
(58) Field of Classification Search
CPC ........... H05K 7/20509; H05K 7/20472; H05K 7/20518

USPC .......................................................... 361/704
See application file for complete search history.

(56) References Cited

U.S. PATENT DOCUMENTS

| 4,768,286 A | * | 9/1988 | Ketcham | ................ H05K 3/284 |
| | | | | 29/841 |
| 5,060,114 A | * | 10/1991 | Feinberg | ............ H05K 7/20454 |
| | | | | 361/706 |
| 5,396,403 A | * | 3/1995 | Patel | ..................... H01L 23/433 |
| | | | | 257/713 |

(Continued)

FOREIGN PATENT DOCUMENTS

| CN | 2598039 Y | 1/2004 |
| CN | 102984317 A | 3/2013 |

(Continued)

*Primary Examiner* — Anatoly Vortman
(74) *Attorney, Agent, or Firm* — Slater Matsil, LLP

(57) ABSTRACT

An electronic device comprises a heat dissipating layer disposed on a rear cover, a first shield cover and a second shield cover disposed on a mainboard, and a speaker box disposed on a surface of an antenna panel. The first region of the heat dissipating layer is in contact with the first shield cover, and the second shield cover is in contact with a first region of a middle frame; a second region of the heat dissipating layer is in contact with a surface of a battery, and the other surface of the battery is in contact with a second region of the middle frame, and a third region of the heat dissipating layer is in contact with a surface of the speaker box that is distant from the antenna panel, and the other surface of the antenna panel is in contact with a third region of the middle frame.

17 Claims, 4 Drawing Sheets

(56) References Cited

U.S. PATENT DOCUMENTS

| | | | | |
|---|---|---|---|---|
| 5,402,313 | A * | 3/1995 | Casperson | H05K 7/2049 |
| | | | | 165/185 |
| 5,956,576 | A * | 9/1999 | Toy | H01L 23/10 |
| | | | | 257/704 |
| 6,365,964 | B1 * | 4/2002 | Koors | H01L 23/3675 |
| | | | | 257/707 |
| 7,031,162 | B2 | 4/2006 | Arvelo | |
| 7,330,356 | B2 * | 2/2008 | Park | H04B 1/036 |
| | | | | 361/720 |
| 7,576,988 | B2 | 8/2009 | Schwarz | |
| 8,587,945 | B1 | 11/2013 | Hartmann | |
| 9,582,051 | B2 | 2/2017 | Jang | |
| 9,901,009 | B2 | 2/2018 | Sugita | |
| 10,120,423 | B1 | 11/2018 | Urban | |
| 2003/0066672 | A1 * | 4/2003 | Watchko | H05K 9/0045 |
| | | | | 174/50 |
| 2015/0316965 | A1 | 11/2015 | Ma | |
| 2015/0316966 | A1 | 11/2015 | Chen | |
| 2016/0094692 | A1 | 3/2016 | Zhang | |
| 2016/0109911 | A1 | 4/2016 | Han | |
| 2016/0285141 | A1 | 9/2016 | Sakaguchi et al. | |
| 2016/0301442 | A1 | 10/2016 | Sohn | |
| 2017/0111989 | A1 | 4/2017 | Wang et al. | |

FOREIGN PATENT DOCUMENTS

| | | | |
|---|---|---|---|
| CN | 203040086 | U | 7/2013 |
| CN | 203151921 | U | 8/2013 |
| CN | 203896662 | U | 10/2014 |
| CN | 104601759 | A | 5/2015 |
| CN | 105472941 | A | 4/2016 |
| CN | 105744811 | A | 7/2016 |
| CN | 105763682 | A | 7/2016 |
| CN | 105794329 | A | 7/2016 |
| CN | 105828551 | A | 8/2016 |
| CN | 206472427 | U | 9/2017 |
| CN | 107547997 | A | 1/2018 |
| CN | 105072868 | B | 4/2018 |
| CN | 105246314 | B | 9/2018 |
| JP | 2009231907 | A | 10/2009 |
| JP | 5028650 | B2 | 9/2012 |
| WO | 2015139357 | A1 | 9/2015 |

* cited by examiner

HEAT DISSIPATION STRUCTURE FOR ELECTRONIC DEVICE AND ELECTRONIC DEVICE

CROSS-REFERENCE TO RELATED APPLICATIONS

This application is a continuation of U.S. patent application Ser. No. 16/337,052, filed on Mar. 27, 2019, which is a national stage of International Application No. PCT/CN2017/103830, filed on Sep. 27, 2017, which claims priority to Chinese Patent Application No. 201621093416.3, filed on Sep. 28, 2016. All of the aforementioned patent applications are hereby incorporated by reference in their entireties.

TECHNICAL FIELD

Embodiments of this application relate to device dissipation technologies, and in particular, to a heat dissipation structure for an electronic device and an electronic device.

BACKGROUND

With development of electronic communications technologies and use requirements of users on electronic devices, the electronic devices implement a growing quantity of functions, and quality of the functions continues to improve. Consequently, power consumption of the electronic device is increasingly high, that is, more heat is generated.

A user may usually obtain a desired sound effect by increasing a volume of the electronic device. However, when the volume of the electronic device is increased, power of a speaker box of the electronic device is increased. Consequently, the speaker box generates more heat. In addition, heat of another element adjacent to the speaker box inside the electronic device is conducted to the speaker box. Consequently, the speaker box also generates more heat.

Currently, the speaker box in the electronic device has a poor heat conduction effect. Consequently, heat dissipation of the speaker box is poor. In this case, when the speaker box generates heat, the heat cannot be effectively conducted for dissipation. Consequently, a partial region of the speaker box in the electronic device overheats.

SUMMARY

Embodiments of this application provide a heat dissipation structure for an electronic device and an electronic device, to avoid local high temperature of the electronic device.

An embodiment of this application provides a heat dissipation structure for an electronic device, including a rear cover, a mainboard, a battery, an antenna panel, a speaker box, and a middle frame, where a heat dissipating layer is disposed on the rear cover, a first shield cover and a second shield cover are disposed on the mainboard, and the speaker box is disposed on a surface of the antenna panel, a first region of the heat dissipating layer is in contact with the first shield cover of the mainboard, and the second shield cover of the mainboard is in contact with a first region of the middle frame, a second region of the heat dissipating layer is in contact with a surface of the battery, and another surface of the battery that is distant from the heat dissipating layer is in contact with a second region of the middle frame, and a third region of the heat dissipating layer is in contact with a surface of the speaker box that is distant from the antenna panel, and another surface of the antenna panel that is distant from the speaker box is in contact with a third region of the middle frame.

In the heat dissipation structure for an electronic device, because the heat dissipating layer disposed on the rear cover may be in contact with the mainboard and the battery, and may also be in contact with the speaker box, the heat dissipation structure for an electronic device implements heat dissipation of the mainboard and the battery, and may further implement heat dissipation of a region of the speaker box, to effectively avoid local high temperature, and implement equalized heat dissipation of the electronic device, thereby improving user experience.

Optionally, the third region of the heat dissipating layer is in contact with a partial or entire region of the surface of the speaker box that is distant from the antenna panel.

Optionally, the third region of the heat dissipating layer is in contact with the surface of the speaker box that is distant from the antenna panel in an adhesive manner, and an adhesive used in the adhesive manner is an adhesive for heat conduction.

Optionally, the third region of the heat dissipating layer is in contact with the surface of the speaker box that is distant from the antenna panel in a welding manner.

Because a material used in the adhesive manner or in the welding manner is a thermally conductive material, when the heat dissipating layer is in contact with the speaker box in the adhesive manner or in the welding manner, thermal conductivity between the heat dissipating layer and the speaker box may be improved, and heat transfer efficiency may be increased.

Optionally, the first region of the heat dissipating layer may also be in contact with the first shield cover of the mainboard in an adhesive manner or in a welding manner, and the second shield cover of the mainboard may also be in contact with the first region of the middle frame in an adhesive manner or in a welding manner. An adhesive used in the adhesive manner may also be an adhesive for heat conduction, and a flux used in the welding manner is a thermally conductive flux.

Because a material used in the adhesive manner or in the welding manner is a thermally conductive material, when the heat dissipating layer is in contact with the first shield cover in the adhesive manner or in the welding manner, thermal conductivity between the heat dissipating layer and the first shield cover may be improved, thereby improving thermal conductivity between the mainboard and the heat dissipating layer, and increasing heat transfer efficiency.

Optionally, the second region of the heat dissipating layer may also be in contact with the battery in an adhesive manner or in a welding manner, and the another surface of the battery that is distant from the heat dissipating layer may also be in contact with the second region of middle frame in an adhesive manner or in a welding manner. An adhesive used in the adhesive manner may also be an adhesive for heat conduction, and a flux used in the welding manner is a thermally conductive flux.

Because a material used in the heat dissipating layer is a thermally conductive material, when the heat dissipating layer is in contact with the battery in by adhering to the battery or being welded to the battery, thermal conductivity between the heat dissipating layer and the battery may be improved, and heat transfer efficiency may be increased.

Optionally, a material of the speaker box is a thermally conductive material, and the thermally conductive material includes any one of the following: thermally conductive plastic, ceramic, and metal.

For the speaker box formed by a thermally conductive material, heat generated by an element inside the speaker box may be better conducted to a surface of the speaker box, for effective dissipation.

Optionally, a dielectric constant of the thermally conductive material is less than or equal to 8, a loss angle of the thermally conductive material is less than or equal to 0.01, and a coefficient of thermal conductivity of the thermally conductive material is greater than or equal to 1 W/(m*K).

The dielectric constant of the thermally conductive material of the speaker box is less than or equal to 8, so that heat generated by an element inside the speaker box can be better conducted to a surface of the speaker box, to effectively avoid electrical interference from the element inside the speaker box. The coefficient of thermal conductivity of the thermally conductive material of the speaker box is greater than or equal to 1 W/(m*K), so that heat conductivity between the element inside the speaker box and the speaker box is improved, and heat transfer efficiency is increased.

Optionally, a charger is further disposed on the antenna panel.

Heat generated by the charger in a charging process may be transferred to the speaker box by using the antenna panel, and then is dissipated by using the heat dissipating layer in contact with the speaker box. Heat dissipation of the region of the speaker box in a charging scenario may also be implemented, to avoid local high temperature of an electronic device, and improve user experience.

Optionally, the heat dissipating layer includes a heat equalizing layer, and the heat equalizing layer is in contact with the mainboard, the battery, and the antenna panel.

The heat equalizing layer can evenly dissipate heat absorbed from the mainboard, the battery, and the speaker box, to effectively avoid local heat dissipation of the electronic device.

Optionally, a coefficient of thermal conductivity of the heat equalizing layer is greater than or equal to 250 W/(m*K).

Optionally, the heat dissipating layer further includes a heat accumulating layer and a heat insulation layer, the heat insulation layer is in contact with the rear cover, and the heat accumulating layer is located between the heat insulation layer and the heat equalizing layer.

The heat accumulating layer can absorb heat from the heat equalizing layer by using a phase change, and stores heat energy, to alleviate temperature rise of the rear cover of the electronic device. The heat insulation layer can stop heat from being directly transferred to the rear cover, to alleviate temperature rise of the rear cover of the electronic device.

Optionally, a specific heat capacity of the heat accumulating layer is greater than or equal to 100 J/(g*K), and a coefficient of thermal conductivity of the heat insulation layer is less than or equal to 0.5 W/(m*K).

Optionally, in a direction perpendicular to the heat dissipating layer, the middle frame is further disposed with a first separating piece and a second separating piece, the first separating piece is configured to separate the mainboard from the battery along a longitudinal direction, the second separating piece is configured to separate the battery from the antenna panel along the longitudinal direction, and the longitudinal direction is a direction perpendicular to the heat dissipating layer.

Optionally, thermally conductive foam is further disposed between the antenna panel and the second separating piece.

The thermally conductive foam disposed between the antenna panel and the second separating piece may implement a heat conduction path sequentially including the battery, the second separating piece, the antenna panel, and the speaker box, to implement heat dissipation on the heat conduction path, and effectively avoid local heat generation of the electronic device.

An embodiment of this application further provides an electronic device, including the heat dissipation structure according to any one of the foregoing descriptions.

The heat dissipation structure for an electronic device and the electronic device are provided in the embodiments of this application. The heat dissipation structure for an electronic device may include the rear cover, the mainboard, the battery, the antenna panel, the speaker box, and the middle frame. The heat dissipating layer is disposed on the rear cover. The first shield cover and the second shield cover are disposed on the mainboard. The speaker box is disposed on the surface of the antenna panel. The first region of the heat dissipating layer is in contact with the first shield cover of the mainboard, and the second shield cover of the mainboard is in contact with the first region of the middle frame. The second region of the heat dissipating layer is in contact with the surface of the battery, and the another surface of the battery that is distant from the heat dissipating layer is in contact with the second region of the middle frame. The third region of the heat dissipating layer is in contact with the surface of the speaker box that is distant from the antenna panel, and the another surface of the antenna panel that is distant from the speaker box is in contact with the third region of the middle frame. In the heat dissipation structure for an electronic device, because the heat dissipating layer disposed on the rear cover may be in contact with the mainboard and the battery, and may also be in contact with the speaker box, the heat dissipation structure for an electronic device implements heat dissipation of the mainboard and the battery, and may further implement heat dissipation of the region of the speaker box, to effectively avoid local high temperature, and implement equalized heat dissipation of the electronic device, thereby improving user experience.

BRIEF DESCRIPTION OF THE DRAWINGS

To describe technical solutions in embodiments of this application or in the prior art more clearly, the following briefly describes the accompanying drawings required for describing the embodiments or the prior art. Apparently, the accompanying drawings in the following description show some embodiments of this application, and persons of ordinary skill in the art may still derive other drawings from these accompanying drawings without creative efforts.

REFERENCE NUMERALS

11: Rear cover;
12: Mainboard;

13: Battery;
14: Antenna panel;
15: Speaker box;
16: Middle frame;
161: First separating piece;
162: Second separating piece;
17: Heat dissipating layer;
171: Heat equalizing layer;
172: Heat accumulating layer;
173: Insulation layer;
18: First shield cover;
19: Second shield cover;
20: Thermally conductive foam;
40: Electronic device;
41: Heat dissipation structure.

DETAILED DESCRIPTION OF ILLUSTRATIVE EMBODIMENTS

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are some but not all of the embodiments of this application. All other embodiments obtained by persons of ordinary skill in the art based on the embodiments of this application without creative efforts shall fall within the protection scope of this application.

Figure 1:
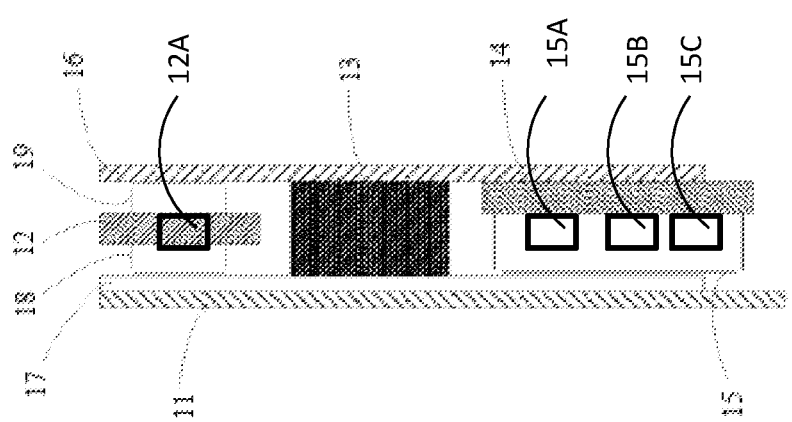
FIG. 1 is a schematic diagram of a heat dissipation structure for an electronic device according to Embodiment 1 of this application.

Embodiment 1 of this application provides a heat dissipation structure for an electronic device. The heat dissipation structure may be located in an electronic device. For example, the electronic device may be an electronic device such as a mobile phone, a notebook computer, or a tablet computer. FIG. 1 is a schematic diagram of the heat dissipation structure for an electronic device according to Embodiment 1 of this application. As shown in FIG. 1, the heat dissipation structure for an electronic device may include a rear cover 11, a mainboard 12, a battery 13, an antenna panel 14, a speaker box 15, and a middle frame 16. A heat dissipating layer 17 is disposed on the rear cover 11. A first shield cover 18 and a second shield cover 19 are disposed on the mainboard 12. The speaker box 15 is disposed on a surface of the antenna panel 14.

A first region of the heat dissipating layer 17 is in contact with the first shield cover 18 of the mainboard 12, and the second shield cover 19 of the mainboard 12 is in contact with a first region of the middle frame 16.

A second region of the heat dissipating layer 17 is in contact with a surface of the battery 13, and the other surface of the battery 13 that is distant from the heat dissipating layer 17 is in contact with a second region of the middle frame 16.

A third region of the heat dissipating layer 17 is in contact with a surface of the speaker box 15 that is distant from the antenna panel 14, and the other surface of the antenna panel 14 that is distant from the speaker box 15 is in contact with a third region of the middle frame 16.

Specifically, the mainboard 12 and the antenna panel 14 each may be a printed circuit board (Printed Circuit Board, PCB for short). An element such as a processor 12A may be integrated on the mainboard 12, and an antenna element such as wiring of an antenna array may be integrated on the antenna panel 14. For example, the antenna element may include at least one antenna of a mobile communications antenna, a Wireless Fidelity (Wireless-Fidelity, Wi-Fi for short) antenna, a Global Positioning System (Global Positioning System, GPS for short) antenna, a Bluetooth (Bluetooth) antenna, a Near Field Communication (Near Field Communication, NFC for short) antenna, a wireless charging (Wireless Charge) antenna, and the like. The mobile communications antenna may be at least one of a 2nd generation (2nd Generation, 2G for short) communications antenna, a 3rd generation (3rd Generation, 3 G for short) communications antenna, a 4th generation (4th Generation, 3 G for short) communications antenna, a 5th generation (5th Generation, 5G for short) communications antenna, and an antenna using a subsequently evolved communication technology. For example, the antenna element may be in a range from 450 MHz to 5 GHz. Usually, the mainboard 12 may also be referred to as a large board, and the corresponding antenna panel 14 may be referred to as a small board.

The mainboard 12 may be disposed with a plurality of shield covers. Interference from a neighboring element to an element on the mainboard 12 may be isolated by using a shield cover. That is, the shield cover is configured to shield and protect electrical characteristics of the element on the mainboard 12. The first shield cover 18 may refer to a shield cover that is in the plurality of shield covers and that is in contact with the heat dissipating layer 17, and the second shield cover 19 may refer to a shield cover that is in the plurality of shield covers and that is in contact with the middle frame 16. That is, the first shield cover 18 and the second shield cover 19 each refer to shield covers of one class, and each may include at least one shield cover. It should be noted that FIG. 1 is described by using only a case in which the first shield cover 18 and the second shield cover 19 each include one shield cover. This application is not limited thereto.

The speaker box 15 may include a sound element such as a speaker (Speaker) 15A and a receiver (Receiver) 15B. The speaker 15A and the receiver 15B may be disposed on the antenna panel 14. The heat dissipating layer 17 may be a thermally conductive layer formed by a thermally conductive material whose coefficient of thermal conductivity is greater than a preset frequency, or may be a composite thermally conductive layer formed by a thermally conductive material and another material. This application is not limited thereto.

The first region of the heat dissipating layer 17 may be in contact with the first shield cover 18 of the mainboard 12, so that heat of the mainboard 12 is transferred to the heat dissipating layer 17 by using the first shield cover 18, to dissipate heat of a region of the mainboard 12. The second shield cover 19 of the mainboard 12 is in contact with the first region of the middle frame 16, so that the mainboard 12 is secured to the middle frame 16, to enable the mainboard 12 to be stable in the electronic device, and effectively ensure performance of the element on the mainboard 12.

The second region of the heat dissipating layer 17 is in contact with the surface of the battery 13, so that heat of the battery 13 may be transferred to the heat dissipating layer 17, to implement heat dissipation of a region of the battery 13. The other surface of the battery 13 that is distant from the heat dissipating layer 17 is also in contact with the second region of the middle frame 16, so that the battery 13 is secured to the middle frame 16, to enable the battery 13 to be stable in the electronic device.

The third region of the heat dissipating layer 17 is in contact with the surface of the speaker box 15 that is distant from the antenna panel 14. A thermal correlation between the heat dissipating layer 17 and the speaker box 15 is actually established, so that heat of the speaker box 15 is transferred to the heat dissipating layer 17, to implement heat dissipation of a region of the speaker box 15. The other surface of the antenna panel 14 that is distant from the speaker box 15 is in contact with the third region of the middle frame 16, and the antenna panel 14 may be secured to the middle frame 16, so that the antenna panel 14 is stable in the electronic device. It should be noted that the heat of the speaker box 15 includes heat generated by a heat emitting element inside the speaker box 15, and further includes heat generated by a part adjacent to the speaker box 15, for example, the antenna panel 14.

The heat dissipation structure for an electronic device provided in Embodiment 1 of this application may include the rear cover, the mainboard, the battery, the antenna panel, the speaker box, and the middle frame. The heat dissipating layer is disposed on the rear cover. The first shield cover and the second shield cover are disposed on the mainboard. The speaker box is disposed on the surface of the antenna panel. The first region of the heat dissipating layer is in contact with the first shield cover of the mainboard, and the second shield cover of the mainboard is in contact with the first region of the middle frame. The second region of the heat dissipating layer is in contact with the surface of the battery, and the other surface of the battery that is distant from the heat dissipating layer is in contact with the second region of the middle frame. The third region of the heat dissipating layer is in contact with the surface of the speaker box that is distant from the antenna panel, and the other surface of the antenna panel that is distant from the speaker box is in contact with the third region of the middle frame. In the heat dissipation structure for an electronic device, because the heat dissipating layer disposed on the rear cover may be in contact with the mainboard and the battery, and may also be in contact with the speaker box, the heat dissipation structure for an electronic device implements heat dissipation of the mainboard and the battery, and may further implement heat dissipation of the region of the speaker box, to effectively avoid local high temperature in scenarios such as a game, a video, and music, and implement equalized heat dissipation of the electronic device, thereby improving user experience.

Optionally, the third region of the heat dissipating layer 17 is in contact with a partial or entire region of the surface of the speaker box 15 that is distant from the antenna panel 14.

Optionally, the third region of the heat dissipating layer 17 may be in contact with the surface of the speaker box 15 that is distant from the antenna panel 14 in an adhesive manner or in a welding manner. An adhesive used in the adhesive manner is an adhesive for heat conduction, and a flux used in the welding manner is a thermally conductive flux.

The other surface of the antenna panel 14 that is distant from the speaker box 15 may be in contact with the third region of the middle frame 16 by using a screw. For example, the screw may be a thermally conductive screw.

Specifically, because the material used heat dissipating layer 17 is a thermally conductive material, when the heat dissipating layer 17 is in contact with the speaker box 15 in by adhering to the speaker box 15 or being welded to the speaker box 15, thermal conductivity between the heat dissipating layer 17 and the speaker box 15 may be improved, and heat transfer efficiency may be increased.

Optionally, the first region of the heat dissipating layer 17 may also be in contact with the first shield cover 18 of the mainboard 12 in an adhesive manner or in a welding manner, and the second shield cover 19 of the mainboard 12 may also be in contact with the first region of the middle frame 16 in an adhesive manner or in a welding manner. An adhesive used in the adhesive manner may also be an adhesive for heat conduction, and a flux used in the welding manner is a thermally conductive flux.

Specifically, because the material used heat dissipating layer 17 is a thermally conductive material, when the heat dissipating layer 17 is in contact with the first shield cover 18 by adhering to the first shield cover 18 or being welded to the first shield cover 18, thermal conductivity between the heat dissipating layer 17 and the first shield cover 18 may be improved, thereby improving thermal conductivity between the mainboard 12 and the heat dissipating layer, and increasing heat transfer efficiency.

Optionally, the second region of the heat dissipating layer 17 may also be in contact with the battery 13 in an adhesive manner or in a welding manner, and the other surface of the battery 13 that is distant from the heat dissipating layer 17 may also be in contact with the second region of middle frame 16 in an adhesive manner or in a welding manner. An adhesive used in the adhesive manner may also be an adhesive for heat conduction, and a flux used in the welding manner is a thermally conductive flux.

Specifically, because the material used heat dissipating layer 17 is a thermally conductive material, when the heat dissipating layer 17 is in contact with the battery 13 by adhering to the battery 13 or being welded to the battery 13, thermal conductivity between the heat dissipating layer 17 and the battery 13 may be improved, and heat transfer efficiency may be increased.

Optionally, a material of the speaker box 15 is a thermally conductive material, and the thermally conductive material includes any one of the following, including thermally conductive plastic, ceramic, metal, and the like.

Specifically, a material of the speaker box 15 is set to a thermally conductive material, so that heat generated by an element inside the speaker box 15 may be better conducted to a surface of the speaker box 15, for effective dissipation. It should be noted that the material of the speaker box 15 may alternatively be another thermally conductive material. The thermally conductive plastic, ceramic, and metal are only examples for illustration. This application is not limited thereto.

Optionally, a dielectric constant of the thermally conductive material is less than or equal to 8, a loss angle of the thermally conductive material is less than or equal to 0.01, and a thermal conduction frequency of the thermally conductive material is greater than or equal to 1 W/(m*K). W is a heat unit watt, m is a unit meter, and K is a thermodynamic temperature unit Kelvin.

Specifically, the dielectric constant of the thermally conductive material of the speaker box 15 is less than or equal to 8, so that heat generated by the element inside the speaker box 15 may be better conducted to the surface of the speaker box 15, to effectively avoid electrical interference from the element inside the speaker box 15. The coefficient of thermal conductivity of the thermally conductive material of the speaker box 15 is greater than or equal to 1 W/(m*K), so that heat conductivity between the element inside the speaker box 15 and the speaker box 15 is improved, and heat transfer efficiency is increased.

Optionally, the antenna panel 14 is further disposed with a charger 15C. The charger may be located inside the speaker box 15.

Specifically, heat generated by the charger in a charging process may be transferred to the speaker box 15 by using the antenna panel 14, and then is dissipated by using the heat dissipating layer 17 in contact with the speaker box 15. Heat dissipation of the region of the speaker box in a charging scenario may also be implemented, to avoid local high temperature of the electronic device, and improve user experience.

Figure 2:
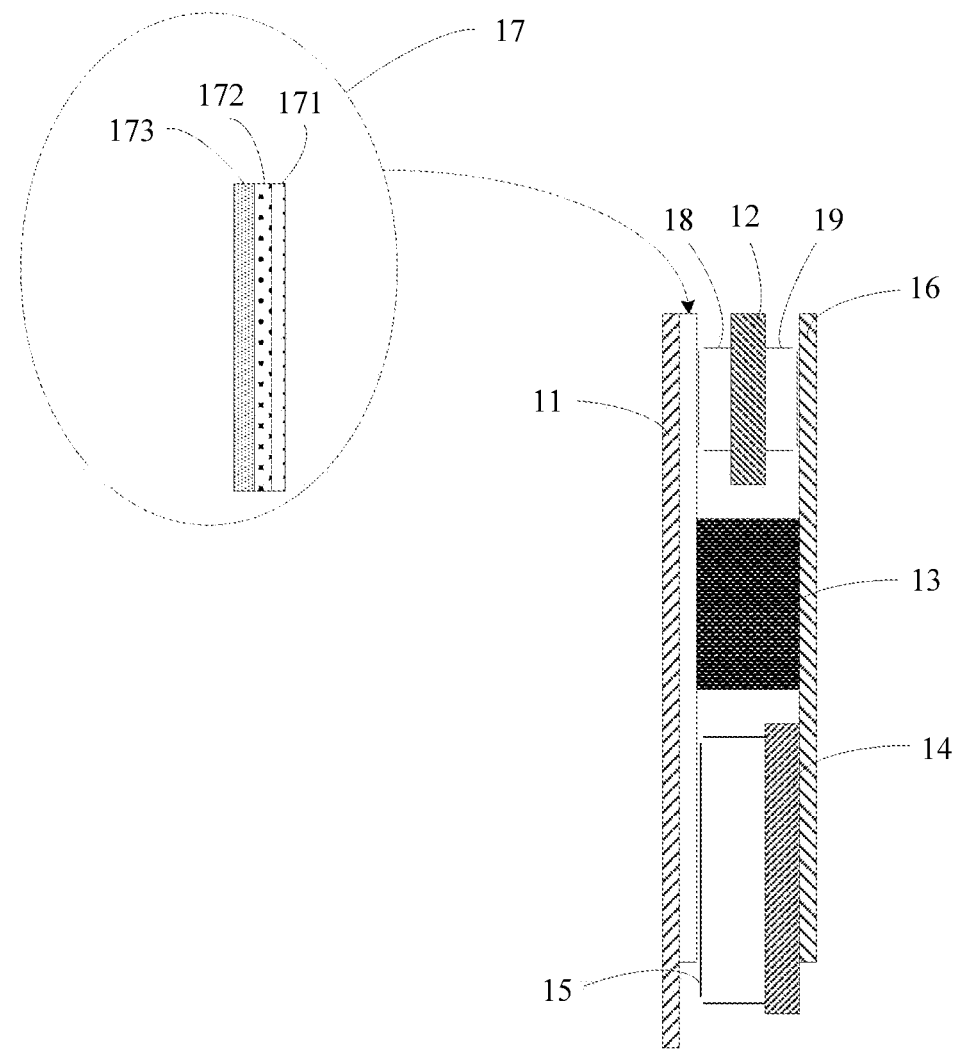
FIG. 2 is a schematic diagram of a heat dissipation structure for an electronic device according to Embodiment 2 of this application.

FIG. 2 is a schematic diagram of a heat dissipation structure for an electronic device according to Embodiment 2 of this application. As shown in FIG. 2, in the foregoing heat dissipation structure for an electronic device, a heat dissipating layer 17 includes a heat equalizing layer 171. The heat equalizing layer 171 is in contact with a mainboard 12, a battery 13, and a speaker box 15.

Specifically, a first region of the heat equalizing layer 171 of the heat dissipating layer 17 may be in contact with a first shield cover 18 of the mainboard 12, and a second shield cover 19 of the mainboard 12 is in contact with a first region of a middle frame 16. A second region of the heat equalizing layer 171 is in contact with a surface of the battery 13. A third region of the heat equalizing layer 171 is in contact with a surface of the speaker box 15 that is distant from an antenna panel 14.

The heat equalizing layer 171 may be formed by a thermally conductive material such as copper foil or graphite, and has a relatively high coefficient of planar thermal conductivity. The heat equalizing layer 171 can be configured to evenly dissipate heat absorbed from the mainboard 12, the battery 13, and the speaker box 15, to effectively avoid local heat dissipation of an electronic device.

Optionally, the coefficient of thermal conductivity of the heat equalizing layer 171 is greater than or equal to 250 W/(m*K).

Optionally, the heat dissipating layer 17 further includes a heat accumulating layer 172 and a heat insulation layer 173. The heat insulation layer 173 is in contact with a rear cover 11. The heat accumulating layer 172 is located between the heat insulation layer 173 and the heat equalizing layer 171.

Specifically, the heat accumulating layer 172 may be formed by a phase change material, and can absorb heat from the heat equalizing layer 171 by using a phase change, and store heat energy, to alleviate temperature rise of the rear cover 11 of the electronic device. The heat insulation layer 173 may be formed by a heat-insulation material, and can prevent heat from being directly transferred to the rear cover 11, to alleviate temperature rise of the rear cover 11 of the electronic device. The heat equalizing layer 171, the heat accumulating layer 172, and the heat insulation layer 173 may have different thicknesses. A thickness ratio of the heat equalizing layer 171, the heat accumulating layer 172, and the heat insulation layer 173 may be, for example, 2:2.5:3.

To ensure electrical performance of an antenna element on the antenna panel 14, the heat equalizing layer 171 may be in contact with a partial region of the surface of the speaker box 15 that is distant from the antenna panel 14. Coverage areas of the heat accumulating layer 172 and the heat insulation layer 173 may be greater than that of the heat equalizing layer.

Optionally, a specific heat capacity of the heat accumulating layer 172 is greater than or equal to 100 J/(g*K), and a coefficient of thermal conductivity of the heat insulation layer 173 is less than or equal to 0.5 W/(m*K). J is a heat unit Joule, g is a mass unit gram, and K is a thermodynamic temperature unit Kelvin.

When the specific heat capacity of the heat accumulating layer 172 is greater than or equal to 100 J/(g*K), a heat storage capability of the heat accumulating layer 172 may be effectively ensured, to effectively alleviate temperature rise of the rear cover 11 of the electronic device. In addition, when the coefficient of thermal conductivity of the heat insulation layer 173 is less than or equal to 0.5 W/(m*K), transfer of heat of the heat accumulating layer 172 to the rear cover 11 may also be effectively alleviated, to effectively alleviate temperature rise of the rear cover of the electronic device.

Figure 3:
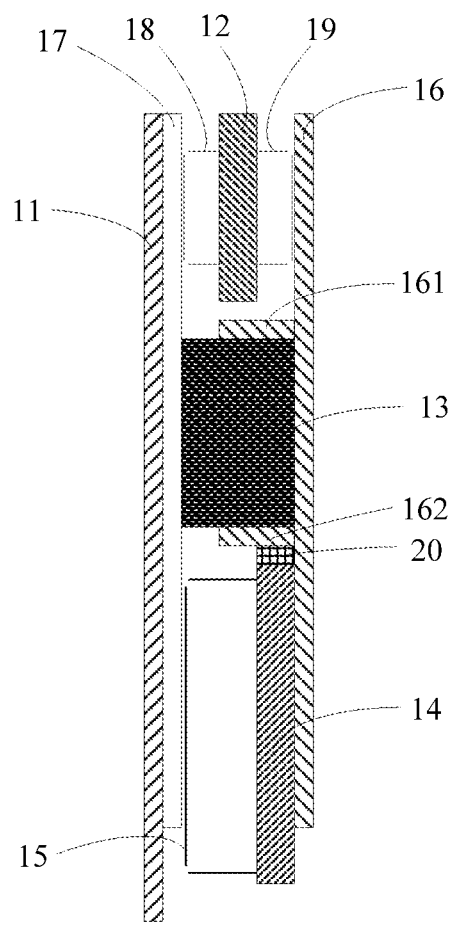
FIG. 3 is a schematic diagram of another heat dissipation structure for an electronic device according to Embodiment 2 of this application.

FIG. 3 is a schematic diagram of another heat dissipation structure for an electronic device according to Embodiment 2 of this application. As shown in FIG. 3, in any one of the foregoing heat dissipation structures for an electronic device, in a direction perpendicular to the heat dissipating layer 17, the middle frame 16 is further disposed with a first separating piece 161 and a second separating piece 162. The first separating piece 161 is configured to separate the mainboard 12 from the battery 13 along a longitudinal direction, the second separating piece 162 is configured to separate the battery 13 from the antenna panel 14 along the longitudinal direction, and the longitudinal direction is a direction perpendicular to the heat dissipating layer 17.

Optionally, thermally conductive foam 20 is further disposed between the antenna panel 14 and the second separating piece 162.

Optionally, the heat dissipation structure for an electronic device may further include a front cover. For example, the front cover may be a display screen of an electronic device. The front cover may be located on one side of the middle frame 16 that is distant from the rear cover 11.

The thermally conductive foam 20 disposed between the antenna panel 14 and the second separating piece 162 may implement a heat conduction path sequentially including the battery 13, the second separating piece 162, the antenna panel 14, and the speaker box 15, to implement heat dissipation on the heat conduction path, and effectively avoid local heat generation of the electronic device.

Figure 4:
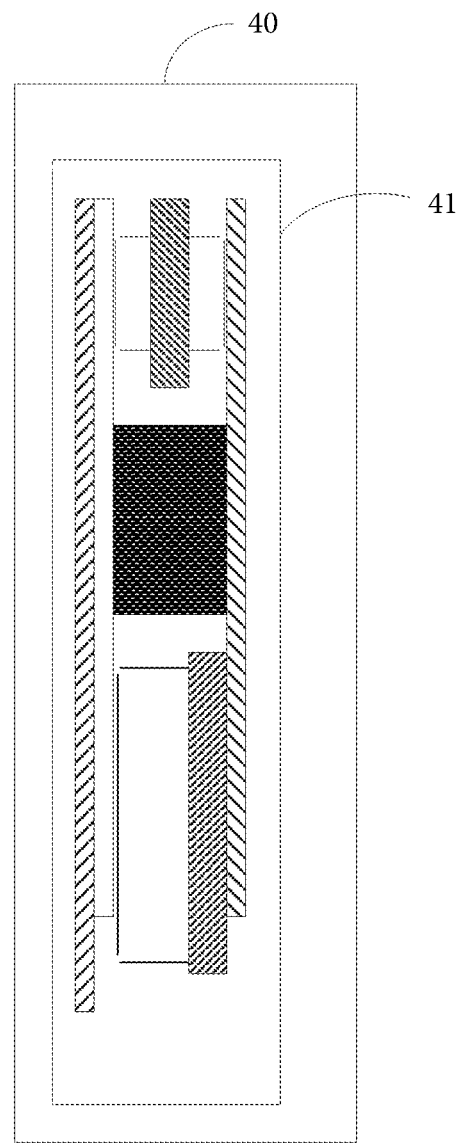
FIG. 4 is a schematic structural diagram of an electronic device according to Embodiment 3 of this application.

Embodiment 3 of this application further provides an electronic device. FIG. 4 is a schematic structural diagram of the electronic device according to Embodiment 3 of this application. As shown in FIG. 4, the electronic device 40 may include a heat dissipation structure 41. The heat dissipation structure 41 may be any one of the heat dissipation structures in FIG. 1 to FIG. 3.

The electronic device provided in Embodiment 3 of this application may include any one of the foregoing heat dissipation structures for an electronic device. Therefore, heat dissipation of the mainboard and the battery inside the electronic device may be implemented, and heat dissipation of a region of the speaker box may also be implemented, to effectively avoid local heat generation of the electronic device, and implement equalized heat dissipation of the electronic device, thereby improving user experience.

Finally, it should be noted that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions in the embodiments of this application.

What is claimed is:
1. A device, comprising:
a rear cover, wherein a heat dissipating layer is disposed on the rear cover;
a middle frame;

a first printed circuit board (PCB), wherein a first shield cover is disposed on a first surface of the first PCB, and a second shield cover is disposed on a second surface of the first PCB;

a battery; and a speaker box;

wherein the first PCB, the battery, and the speaker box are disposed between the rear cover and the middle frame, the first PCB is separated from the speaker box by the battery;

wherein a first region of the heat dissipating layer corresponds to the first shield cover of the first PCB, the second shield cover of the first PCB is in contact with a first region of the middle frame;

wherein a second region of the heat dissipating layer corresponds to the battery, and a surface of the battery that is distal to the heat dissipating layer is in contact with a second region of the middle frame; and wherein a third region of the heat dissipating layer corresponds to the speaker box.

2. The device according to claim 1, wherein the device further comprises a second printed circuit board (PCB), wherein the speaker box is disposed on a first surface of the second PCB, and a second surface of the second PCB that is distal to the speaker box is in contact with a third region of the middle frame.

3. The device according to claim 2, wherein the third region of the heat dissipating layer is adhered to a first surface of the speaker box by a heat conducting adhesive.

4. The device according to claim 2, wherein a charger is further disposed on the second PCB.

5. The device according to claim 2, wherein the heat dissipating layer comprises a heat equalizing layer, and wherein the heat equalizing layer is in contact with the first PCB, the battery, and the second PCB.

6. The device according to claim 5, wherein a coefficient of thermal conductivity of the heat equalizing layer is greater than or equal to 250 W/(m*K).

7. The device according to claim 5, wherein the heat dissipating layer further comprises a heat accumulating layer and a heat insulation layer, wherein the heat insulation layer is in contact with the rear cover, and wherein the heat accumulating layer is between the heat insulation layer and the heat equalizing layer.

8. The device according to claim 7, wherein a specific heat capacity of the heat accumulating layer is greater than or equal to 100 J/(g*K), and wherein a coefficient of thermal conductivity of the heat insulation layer is less than or equal to 0.5 W/(m*K).

9. The device according to claim 2, wherein the middle frame comprises a first separating piece and a second separating piece, wherein the first separating piece separates the first PCB from the battery along a longitudinal direction, wherein the second separating piece separates the battery from the second PCB along the longitudinal direction, and wherein the longitudinal direction is a direction perpendicular to a major surface of the heat dissipating layer.

10. The device according to claim 9, wherein a thermally conductive foam is between the second PCB and the second separating piece.

11. The device according to claim 2, wherein an antenna is further disposed on the second PCB.

12. The device according to claim 1, wherein the third region of the heat dissipating layer welded to a first surface of the speaker box.

13. The device according to claim 1, wherein a material of the speaker box is a thermally conductive material, and the thermally conductive material comprises thermally conductive plastic, ceramic, or metal.

14. The device according to claim 13, wherein a dielectric constant of the thermally conductive material is less than or equal to 8, wherein a loss angle of the thermally conductive material is less than or equal to 0.01, and wherein a coefficient of thermal conductivity of the thermally conductive material is greater than or equal to 1 W/(m*K).

15. The device according to claim 1, wherein a processor is further disposed on the first PCB.

16. The device according to claim 1, wherein the speaker box comprises a speaker.

17. The device according to claim 1, wherein the heat dissipating layer is formed by graphite.

* * * * *